(12) United States Patent
Lin et al.

(10) Patent No.: US 11,804,392 B2
(45) Date of Patent: *Oct. 31, 2023

(54) METHOD OF MONITORING TOOL

(71) Applicant: TAIWAN SEMICONDUCTOR MANUFACTURING CO., LTD., Hsinchu (TW)

(72) Inventors: Hom-Chung Lin, Taichung (TW); Chi-Ying Chang, Taichung (TW); Jih-Churng Twu, Hsinchu County (TW); Chin-Yun Chen, Taipei (TW); Yi-Ting Chang, Tainan (TW); Feng-Yu Chen, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/568,611

(22) Filed: Jan. 4, 2022

(65) Prior Publication Data

US 2022/0130697 A1 Apr. 28, 2022

Related U.S. Application Data

(63) Continuation of application No. 16/539,708, filed on Aug. 13, 2019, now Pat. No. 11,239,099.

(60) Provisional application No. 62/737,689, filed on Sep. 27, 2018.

(51) Int. Cl.
*H01L 21/67* (2006.01)
*H01L 21/677* (2006.01)

(52) U.S. Cl.
CPC .. *H01L 21/67259* (2013.01); *H01L 21/67763* (2013.01)

(58) Field of Classification Search
CPC ......... H01L 21/67379; H01L 21/67294; H01L 21/67393; H01L 21/67028; H01L 21/67389; H01L 21/67775; H01L 21/27394; H01L 21/67242; H01L 21/67253
See application file for complete search history.

(56) References Cited

U.S. PATENT DOCUMENTS 6,273,261 B1 * 8/2001 Hosoi ............... H01L 21/67379
206/711
11,239,099 B2 * 2/2022 Lin ................... H01L 21/67259
(Continued)

FOREIGN PATENT DOCUMENTS

CN 101459099 A 6/2009
CN 206639779 U 11/2017
(Continued)

*Primary Examiner* — Alia Sabur
(74) *Attorney, Agent, or Firm* — Maschoff Brennan

(57) ABSTRACT

A method includes transferring a tool monitoring device to a load port of a tool. An environmental parameter of the load port is monitored by the tool monitoring device. The tool monitoring device is removed from the load port after the environmental parameter of the load port is monitored. A door of the tool in front of the load port is closed. The door of the tool is kept closed during a period from a time of transferring the tool monitoring device to the load port to a time of removing the tool monitoring device from the load port.

20 Claims, 13 Drawing Sheets

(56) References Cited

U.S. PATENT DOCUMENTS

| | | | |
|---|---|---|---|
| 2003/0001116 A1* | 1/2003 | Elliott | H01L 21/67259 250/559.4 |
| 2003/0187537 A1* | 10/2003 | Hocke | H01L 21/67294 700/121 |
| 2006/0013674 A1* | 1/2006 | Elliott | H01L 21/67775 414/940 |
| 2007/0185687 A1* | 8/2007 | Speasl | G03F 7/7075 702/185 |
| 2011/0054665 A1 | 3/2011 | Wingbermuehle et al. | |
| 2011/0158774 A1 | 6/2011 | Yamaguchi | |
| 2013/0150997 A1 | 6/2013 | Tsai et al. | |
| 2014/0067324 A1 | 3/2014 | Ho et al. | |
| 2014/0200702 A1* | 7/2014 | Liu | H01L 21/02 700/121 |
| 2015/0068554 A1 | 3/2015 | Chen | |
| 2017/0049284 A1* | 2/2017 | Wang | A47L 9/02 |
| 2018/0161830 A1* | 6/2018 | Sasaki | B08B 5/00 |
| 2018/0358249 A1 | 12/2018 | Nagaike | |

FOREIGN PATENT DOCUMENTS

| | | |
|---|---|---|
| TW | 200908069 A | 2/2009 |
| TW | 201624162 A | 7/2016 |

\* cited by examiner

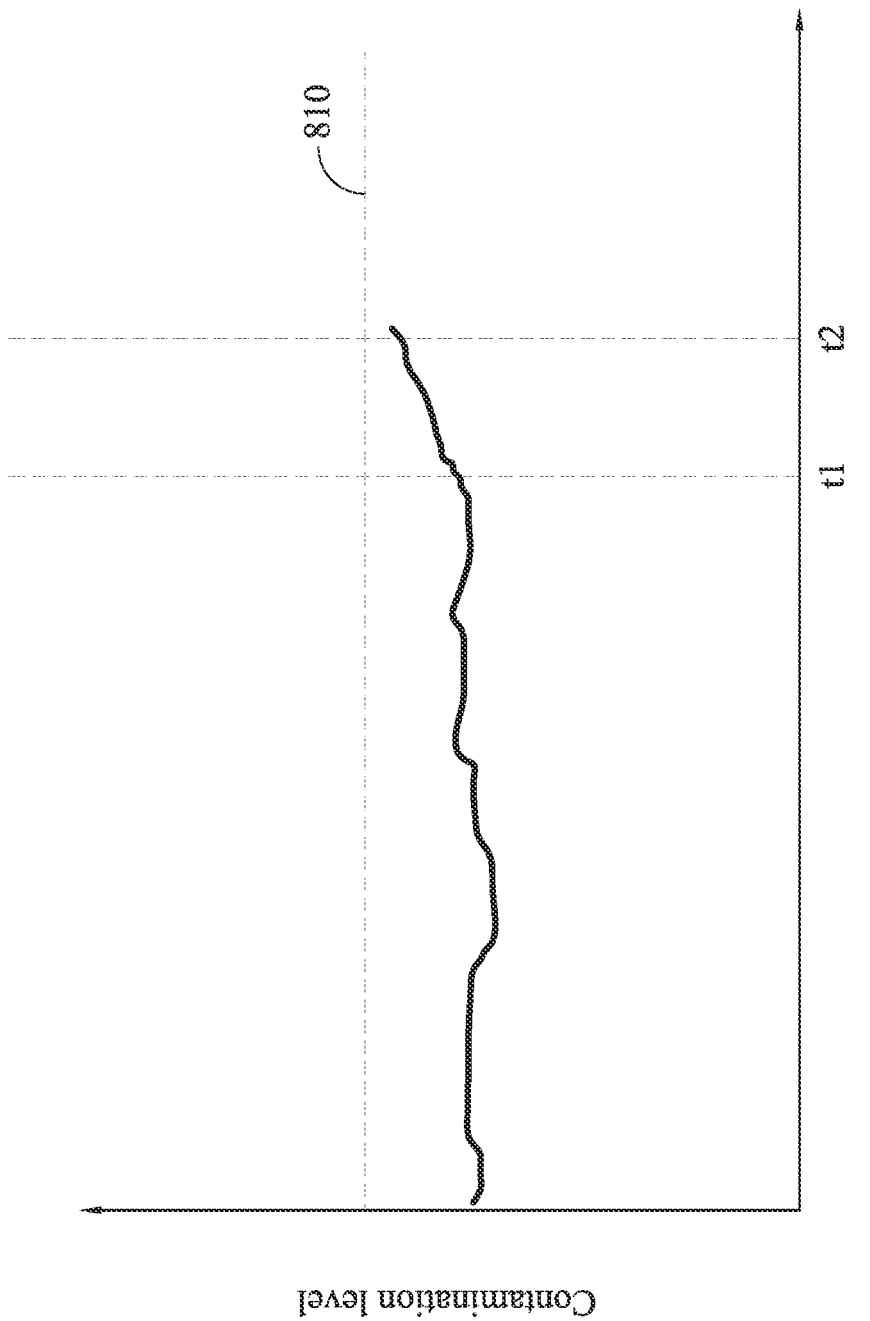

METHOD OF MONITORING TOOL

PRIORITY CLAIM AND CROSS-REFERENCE

This application is a continuation application of U.S. patent application Ser. No. 16/539,708, filed Aug. 13, 2019, which claims priority to U.S. Provisional Application Ser. No. 62/737,689, filed Sep. 27, 2018, which is herein incorporated by reference in its entirety.

BACKGROUND

During manufacturing semiconductor integrated circuits (ICs), semiconductor wafers are subjected to various processing operations at different processing tools. For example, to complete the fabrication of an IC chip, various operations of deposition, cleaning, ion implantation, etching, and/or passivation operations are generally carried out in different processing tools. Therefore, fabrication facilities generally include transportation systems such as an automated material handling system (AMHS) for transporting the semiconductor wafers among the processing tools.

Further, in a fabrication facility, due to the delicate nature of the chips, an environment of a load port of each of the tools should be carefully controlled. Abnormalities in a leveling state, vibration, temperature, humidity, or contamination level around the load ports increase the risk of unexpected particles or features formed on the wafers and decrease the yield rate of the manufacturing process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 11 shows a trend of a contamination level of a load port.

DETAILED DESCRIPTION

Figure 1A:
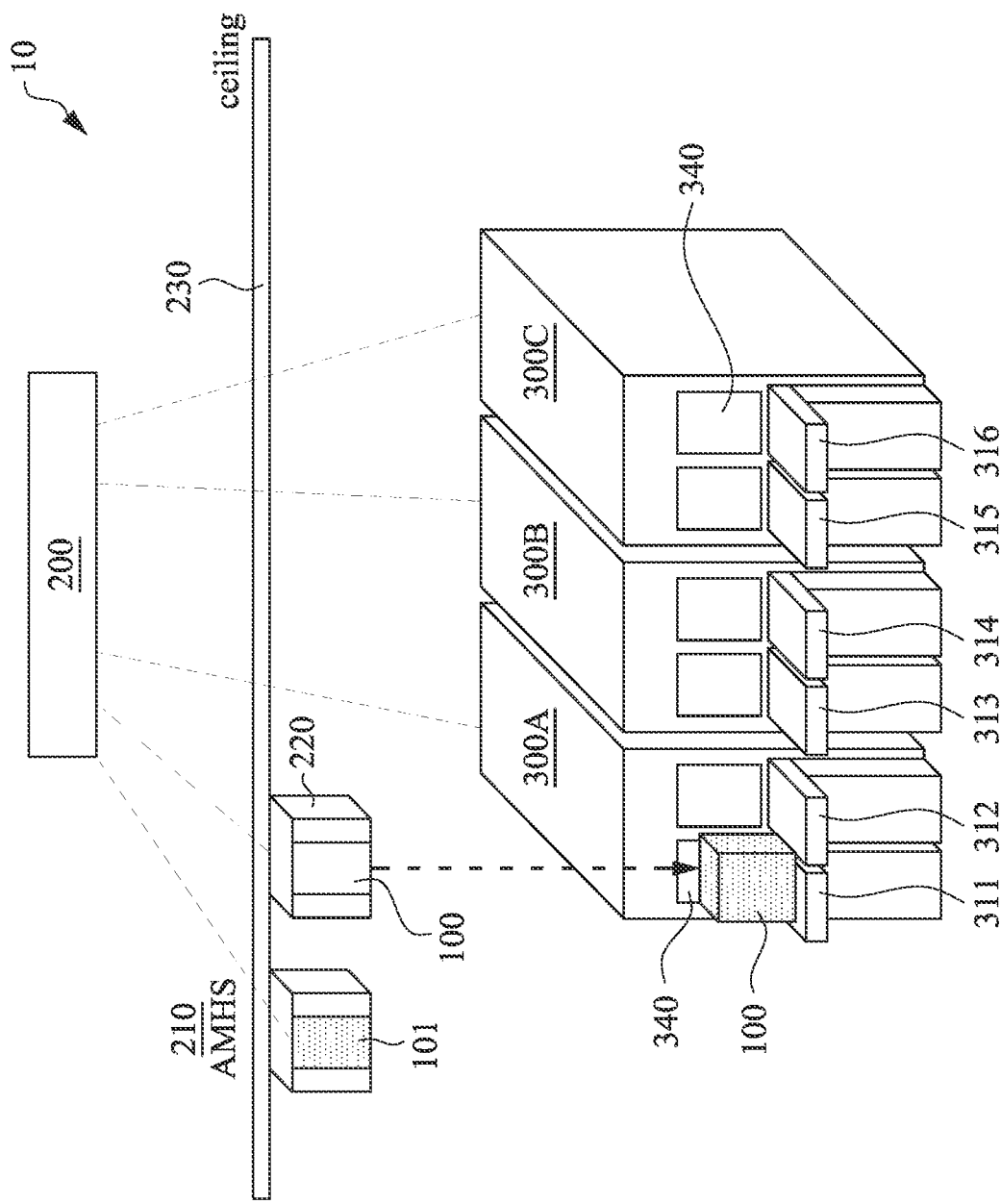
FIG. 1A is a schematic view showing a processing and monitoring system in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a manufacturing process of a semiconductor device, various process tools, each of which includes a processing module and one or more load ports, are configured to process one or more semiconductor wafers. The process module is configured to process the semiconductor wafers, and the load port is configured to enable a wafer pod to be placed at the process tools. Tool conditions such as temperature, humidity and degree of contamination are quite critical in the manufacturing process. Generally, the tool conditions in the process module are automatically and strictly monitored and controlled during the manufacturing process. In contrast, the tool conditions of the load port are manually monitored, and this may result in a failure to report the tool conditions of the load port in time. In addition, the tool conditions of the load port are not recorded on a long-term basis, causing a higher risk of cracks forming in the tools. In pursuit of a high quality, a high yield and a high performance of the semiconductor device, a device, a system and a method that can monitor the tool conditions of the load ports in real time (or in situ) are required.

Embodiments of the present disclosure are directed to providing a tool monitoring device, a system including the tool monitoring device and a method using the system. In some embodiments, the tool monitoring device is disposed in a vacant wafer pod (i.e., no wafer is housed in the wafer pod), and then the tool monitoring device can be transferred by a transporting system, so that the tool monitoring device can go around each load port of the tools and regularly monitor one or more environmental parameters around the load port. Such a tool monitoring device is capable of monitoring the environmental parameters in real time. Furthermore, the number of times in a certain time interval that each load port is monitored can be adjusted depending on practical situations, such that any problems with the tools can be immediately reported, and the time required for dealing with tool problems and the possibility of cracks forming in the tools may be reduced.

FIG. 1A is a schematic view showing a processing and monitoring system in accordance with some embodiments of the present disclosure. In some embodiments, a processing and monitoring system 10 includes a tool monitoring device 100, a wafer pod 101 housing plural wafers to be processed, a controlling apparatus 200, a transporting system 210 and several tools 300A, 300B and 300C, in which the tool monitoring device 100, the wafer pod 101, the transporting system 210 and the tools 300A-300C are coupled to and controlled by the controlling apparatus 200. In some embodiments, the transporting system 210 may be an automatic material handling system (AMHS), and the transporting system 210 may be referred to as the AMHS 210 hereinafter. The AMHS 210 includes at least one stationary track or rail 230 (in some embodiments, a network of such tracks or rails) operable to guide the movement of a wheeled overhead hoist transfer (OHT) vehicle 220 supported and suspended from the rail 230. In some embodiments, the rail 230 is a monorail that is mounted to and suspended from the ceiling and/or walls of a semiconductor fabrication facility (FAB). The rail 230 may have any suitable cross-sectional configuration as will be appreciated by those in the art, so long as the OHT vehicle 220 is appropriately supported by the rail for rolling motion. The OHT vehicle 220 is operable to transport one or more wafer pods through the FAB for intra-bay or inter-bay movement. The OHT vehicle 220 is configured and structured to hold wafer pods (e.g., the wafer pod 101 housing several wafers or the wafer pod including the tool monitoring device 100) and transport the wafer pods in a generally horizontal or lateral direction from one location to another within the FAB.

Figure 1B:
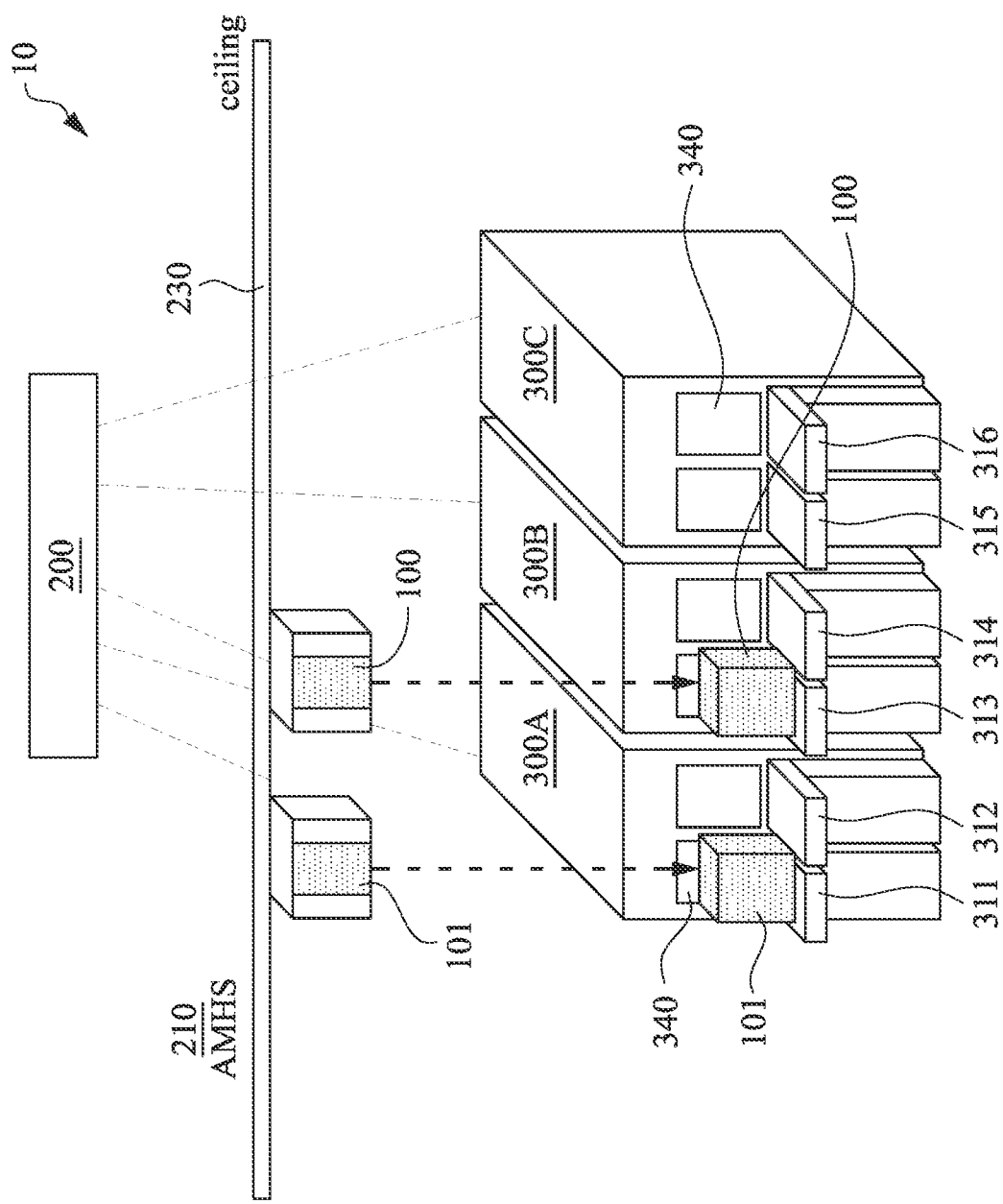
FIG. 1B shows an intermediate stage where a tool monitoring device is transferred from a load port to another load port.

In some embodiments, at least one of the wafer pods includes the tool monitoring device 100, such that the tool monitoring device 100 may be carried by the OHT vehicle 220 of the AMHS 210. Reference is made to FIG. 1A and FIG. 1B. FIG. 1B shows an intermediate stage where a tool monitoring device is transferred from a load port to another load port. The tool monitoring device 100 may be disposed on a load port 311 of a tool 300A to monitor one or more environmental parameters around the load port 311. Next, the tool monitoring device 100 may be transferred to a load port 313 of a tool 300B to monitor one or more environmental parameters around the load port 313. In some embodiments, when the tool monitoring device 100 is transferred from the load port 311 to the load port 313, the wafer pod 101 is placed on the load port 311 which has been monitored. The order in which the load ports 311 and 313 are monitored is given by way of illustration for clear understanding of the present disclosure, and should not limit the scope of the present disclosure. Other monitoring orders may be implemented in other embodiments.

In some embodiments, the AMHS 210 includes several OHT vehicles 220 for carrying plural condition monitoring devices 100, such that plural load ports 311-316 may be monitored simultaneously. For example, in some embodiments where two or more wafer pods 101 housing the wafers are provided, one of the wafer pods 101 may be configured as shown in FIG. 1A and the other wafer pod 101 (not shown) housing the wafer pods may be configured in front of the tool monitoring device 100 (e.g., aligned with the load port 313). In such embodiments, when the environmental parameters of the load port 311 are monitored by the tool monitoring device 100, the wafer pod 101 housing the wafers may be disposed on the load port 313, such that the wafers may be loaded into the tool 300B through a tool access door 340, and the wafers may be processed by the tool 300B. The tool access door 340 facilitates the semiconductor wafers entering and/or leaving the processing module. In some embodiments, the tools 300A-300C perform a single wafer fabrication task on the wafers in a given lot. For example, a particular fabrication tool may perform depositing, patterning, doping, implanting or heating treatment operations.

Figure 1C:
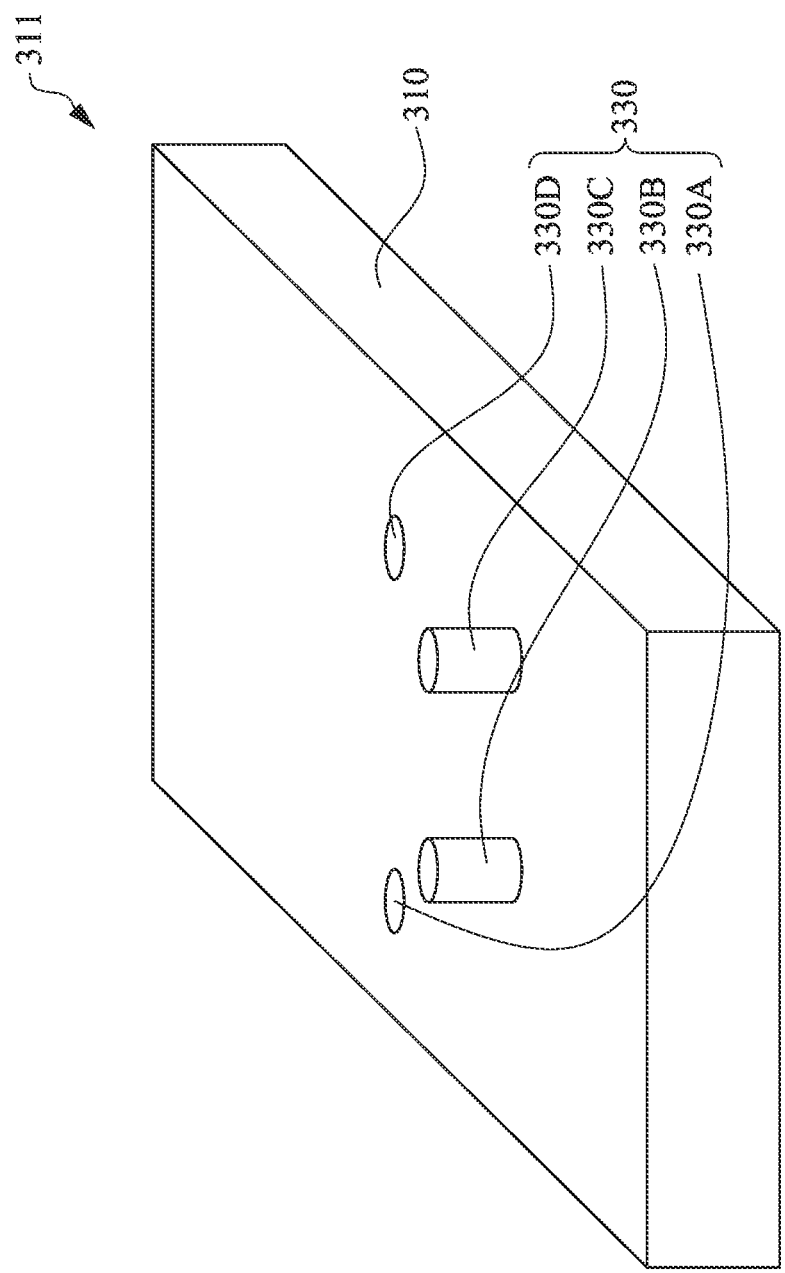
FIG. 1C is an enlarged view of a load port of FIG. 1A.

Reference is made to FIG. 1A and FIG. 1C. FIG. 1C is an enlarged view of a load port of FIG. 1A. Each of the load ports 311, 312, 313, 314, 315 and 316 may include a platform 310 and one or more pins 330 on the platform 310, in which the platform 310 is arranged adjacent to a tool access door 340 of each of the tools 300A-300C, and the pins 330 are configured for positioning the wafer pods that carry the wafers or the tool monitoring device 100. The pins 330 may be further used as an identifier according to their different heights, such as the pins 330A, 330B, 330C and 330D. A height configuration of these pins 330A-330D will be identified by the tool monitoring device 100 to acquire the corresponding standards of the environmental parameters of the load port (to be described hereinafter).

Figure 2:
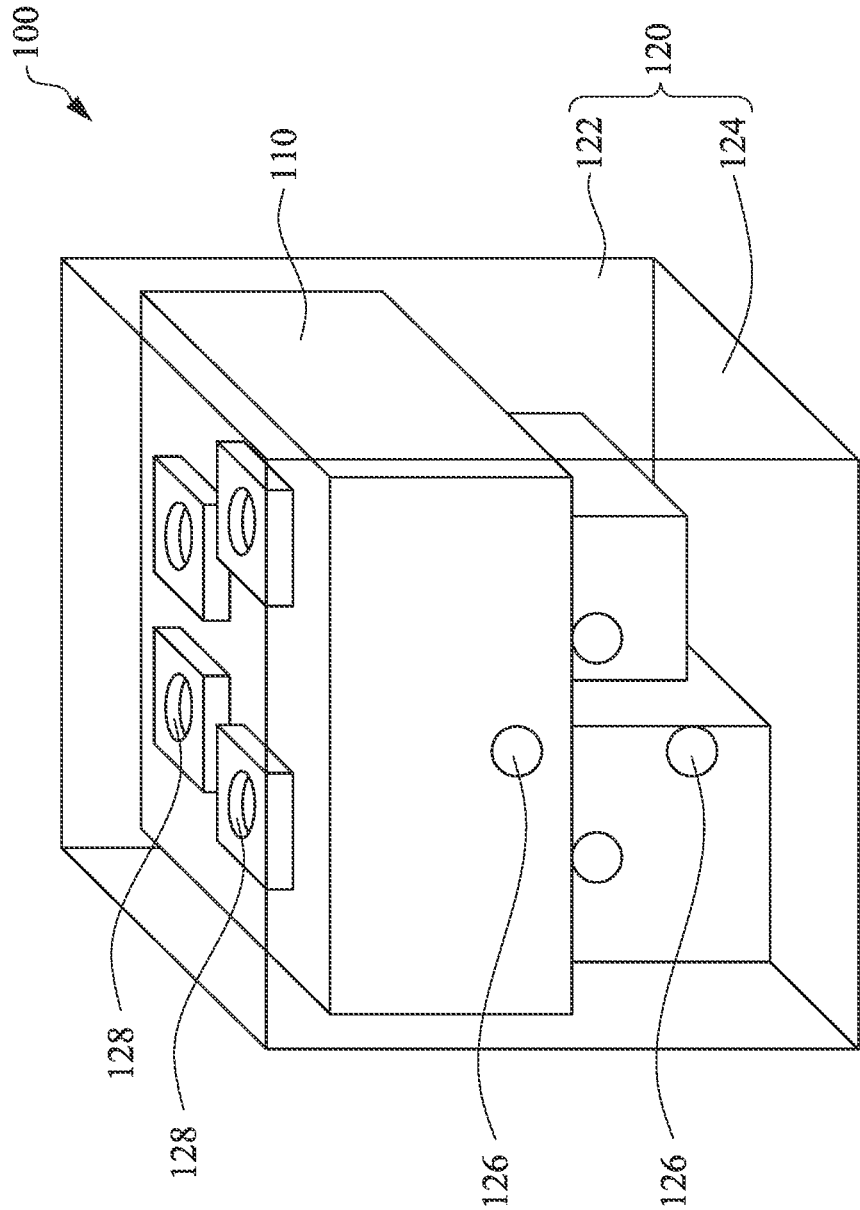
FIG. 2 is a schematic 3-D view of a tool monitoring device in accordance with some embodiments of the present disclosure.

Reference is made to FIG. 2. FIG. 2 is a schematic 3-D view of a tool monitoring device in accordance with some embodiments of the present disclosure. As shown in FIG. 2, the tool monitoring device 100 is accommodated in a wafer pod 120, and the tool monitoring device 100 includes a monitoring module 110 that monitors (or detects) the environmental parameters of the load ports 311-316 of FIG. 1A. In some embodiments, the wafer pod 120 includes a pod shell 122 and a base plate 124. The pod shell 122 is disposed on the base plate 124. The wafer pod 120 may further include a pod door (not shown) detachably disposed on the pod shell 122, and the pod door may be opened, so as to arrange the monitoring module 110 inside the wafer pod 120. In some embodiments, the wafer pod 120 may be a standard mechanical interface (SMIF) or a front opening unified pod (foup) that are usually used to contain and deliver wafers in a semiconductor manufacturing process. However, the wafer pod 120 is vacant and no wafer is placed in the wafer pod 120. In some embodiments, plural light-emitting devices 126 may be arranged on an outer wall of the pod shell 122, in which the light-emitting devices 126 may be coupled to the tool monitoring device 100 to show states of the tool monitoring device 100. For example, the level of electric power or errors associated with the tool monitoring device 100 may be shown by emitting different colors of light or illuminating different numbers of the light-emitting devices 126.

Figure 3:
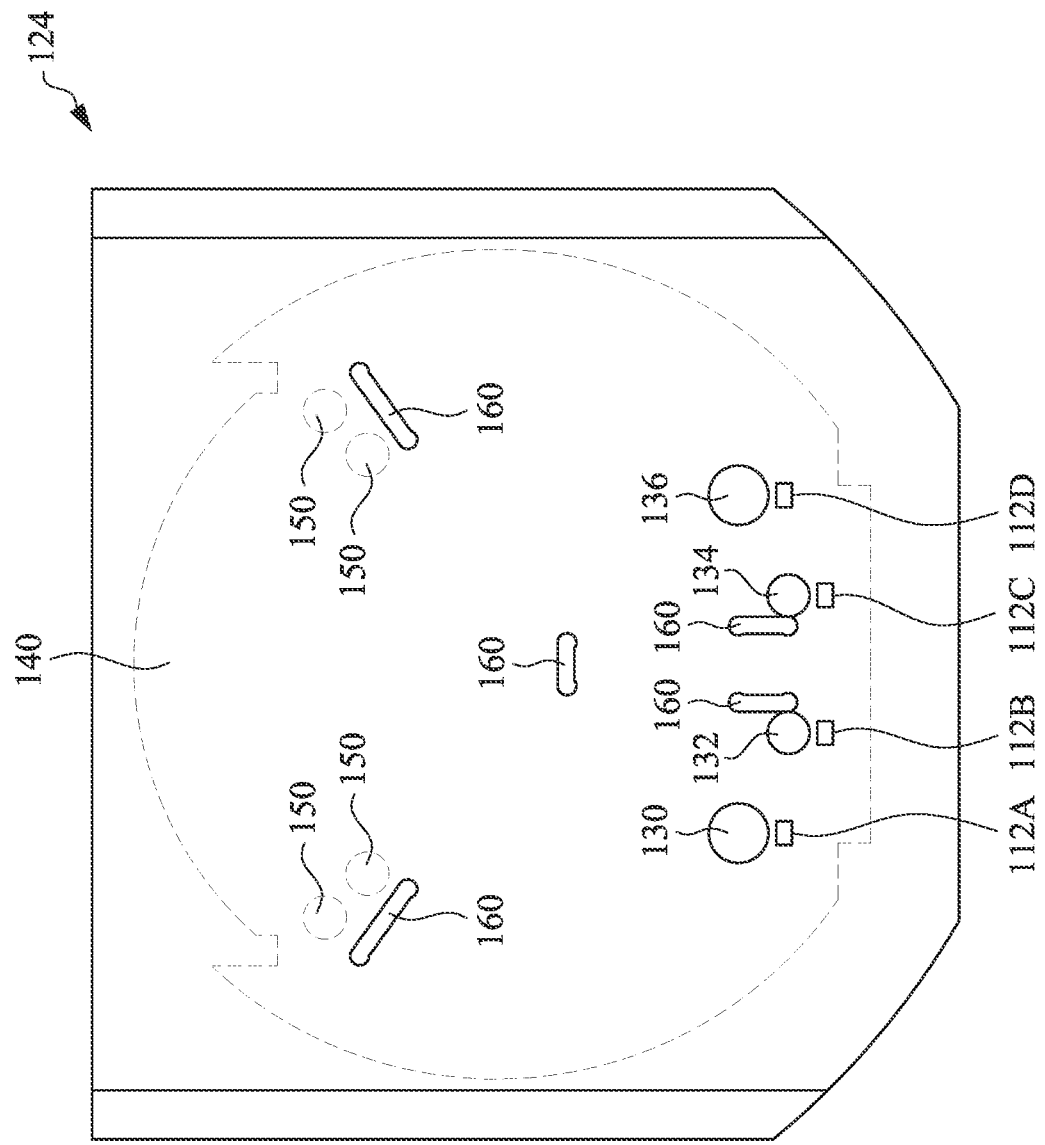
FIG. 3 is a top view of a base plate of a tool monitoring device in accordance with some embodiments of the present disclosure.

Reference is made to FIG. 3. FIG. 3 is a top view of a base plate of a tool monitoring device in accordance with some embodiments of the present disclosure. The base plate 124 may include plural holes 130, 132, 134 and 136, which correspond to the pins 330A-330D on each of the load ports 311-316 of FIG. 1A-FIG. 1C. In some embodiments, the wafer pod 101 may include one or more sensors 112A-112D arranged in proximity to (or adjacent to) each of the holes 130-136 on the base plate 124 for communicating information about the load ports 311-316. An area 140 corresponding to a cassette of the wafer pod 101 holding the wafers may be defined on the base plate 124, in which some sensors may be arranged in the area 140 for monitoring the environmental parameters of certain regions of the load port where the wafer pod 101 housing the wafers may be disposed. In some embodiments, the base plate 124 may include one or more positioning elements 150 that correspond to kinematic pins on the load ports 311-316. In some embodiments, one or more leveling position sensors 112E that are used to monitor a leveling state of the load port are disposed on the base plate 124. For example, the leveling position sensors may be arranged over pads 160.

Figure 4:
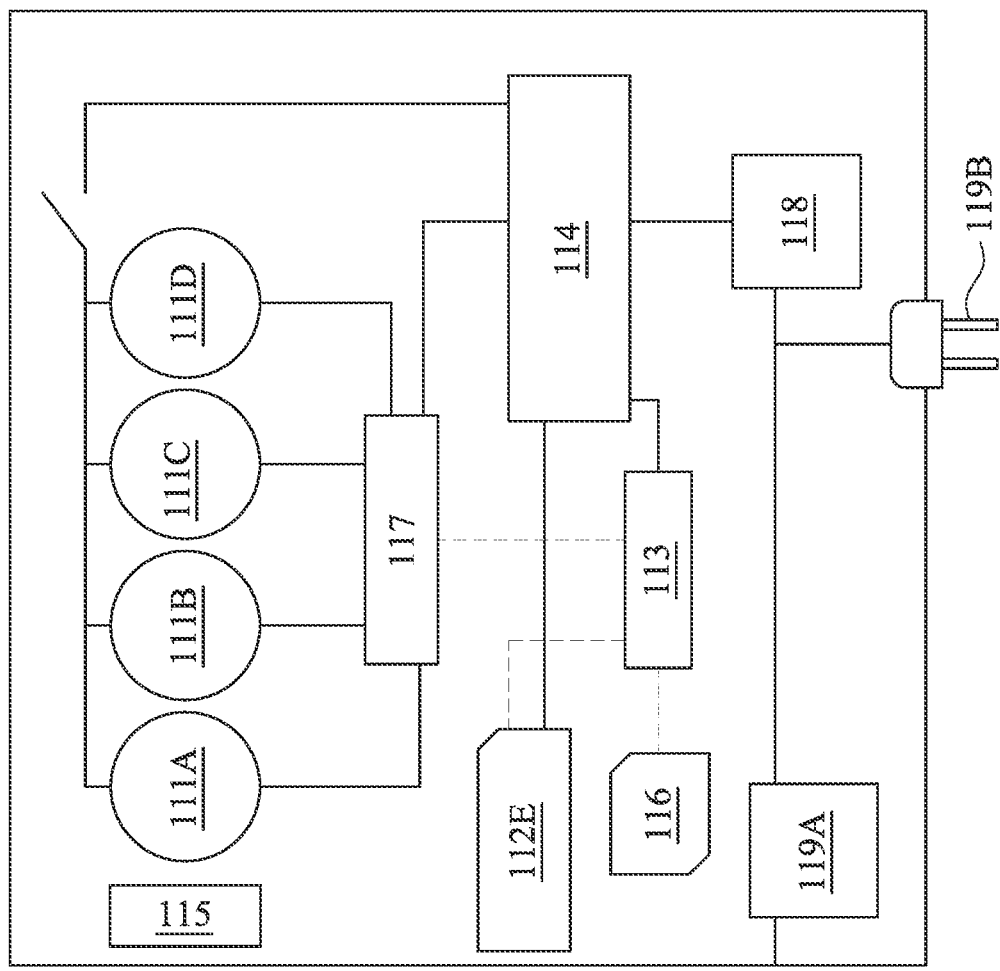
FIG. 4 is a schematic block diagram showing a configuration of a monitoring module in accordance with some embodiments of the present disclosure.

In some embodiments, the monitoring module 110 may include a variety of sensors, computers, batteries or other elements. Reference is made to FIG. 1A, FIG. 1C and FIG. 4. FIG. 4 is a schematic block diagram showing a configuration of a monitoring module in accordance with some embodiments of the present disclosure. In FIG. 4, dotted lines indicate signal lines, and solid lines indicate power lines. As shown in FIG. 4, the monitoring module 110 includes one or more sensors 111A, 111B, 111C, 111D, and 112E, a processor 113, a power supply 114, a tag 115, and a wireless unit 116. The sensors 111A-111D and 112E are configured to monitor the environmental parameters of the load ports 311-316.

Before monitoring the environmental parameters of the load ports 311-316, the type of the load ports 311-316 should be identified. In some embodiments, as described in FIG. 1C, the sensors 112A-112D are arranged in proximity to the holes 130-136, so as to identify the types of the load ports 311-316 (i.e., identify which tools the load ports belong to). In some embodiments, the sensors 112A-112D detect a height configuration of the pins 330A-330D, and one type of the tool may correspond to one height configuration of the pins 330A-330D, so as to acquire predetermined standards of the environmental parameters. It is noted that different tools may have different standards for the environmental parameters.

In some embodiments, the sensors 111A-111D are used to monitor a contamination level of the pins 330A-330D on the load ports 311-316. For example, the sensors 111A-111D for monitoring the contamination level of the pins 330A-330D may include particle counters, each of which is arranged on the holes 130-136 of FIG. 3, such that the pins 330A-330D of each of the load ports 311-316 may be disposed in the particle counters and an amount of the contaminant particles on the pins 330 is detected. In some embodiments, the sensors 111A-111D may be coupled to an amplifier 117 to adjust the standards or other parameters for the sensors 111A-111D.

In some embodiments, the sensor 112E may be a leveling position sensor that detects a leveling state of the load port. In certain embodiments, the leveling position senor may be an inclinometer (or a micro tilt sensor). For example, the leveling state of the area 140 of the load port may be monitored. When the wafer pod 101 housing the wafers to be processed by the tools 300A-300C is disposed on the load port that is improperly leveled, the wafers may collide with the cassette, causing damage to the wafers and generating wafer scraps as well as particles in the load port. Therefore, the leveling state of the load ports is monitored, such that the leveling state of the load ports can be properly adjusted in a timely manner, and damage to the wafer and the contamination of the load port can be prevented. The sensor 112E may be, for example, a contactless position sensor. In some other embodiments, the monitoring module 110 includes some other sensors that are not illustrated in FIG. 4, in which such sensors are arranged in a manner similar to the configuration of the sensor 112E, and in which such sensors may be used to monitor vibration, temperature, humidity, air, noise, bio-hazardous particles, any suitable environmental parameters, or combinations thereof. In other embodiments, one or more charge-coupled devices (CCD) 128 shown in FIG. 2 may be disposed in the tool monitoring device 100 using a configuration similar to that of the sensor 112E. In such embodiments, the CCDs 128 are arranged on a top of the tool monitoring device 100, and artificial intelligence (AI) may be utilized for processing the images obtained from the CCD 128.

The processor 113 is configured to control the control operations of the monitoring module 110. In some embodiments, the operations may include (but is not limited to) recording the monitored environmental parameters, storing the parameters in a storage device, determining whether the monitored environmental parameters comply with the predetermined standards, sending alarms to one or more devices and any combination thereof. In some embodiments, the processor 113 may be a microcomputer including a storage device (not shown).

The power supply 114 is configured to provide electric power to the sensors 111A-111D and 112E and the processor 113. In some embodiments, the power supply 114 may be a battery pack, and it may be further coupled to a charging module 118. In some embodiments, the charging module 118 includes a pin 119A that can be electrically coupled to a charging station (to be described hereinafter). In some embodiments, the pin 119A may be a pogo pin. In some other embodiments, the charging module 118 may be coupled to a plug 119B, such that the tool monitoring device 100 may be directly charged using a socket.

The tag 115 is configured to transfer data to allow for automatic identification and tracking by a tag reader, for example, configured in the charge station. In some embodiments, the tag 115 may be a radio frequency identification (RFID) tag. The wireless unit 116 is configured to transmit/receive measurement results or manipulation commands. The measurement results may include the monitored signals of the environmental parameters, the level of electric charge of the battery pack, a storage capacity of the storage device, or any other information. The manipulation commands may include transmitting alarms to external devices or systems, transmitting signals from the charging station or any other commands. In some embodiments, the wireless unit 116 may include a BLUETOOTH unit, a wireless LAN unit, an infrared communication unit, a laser transceiver, or any other applicable wireless unit.

Figure 5:
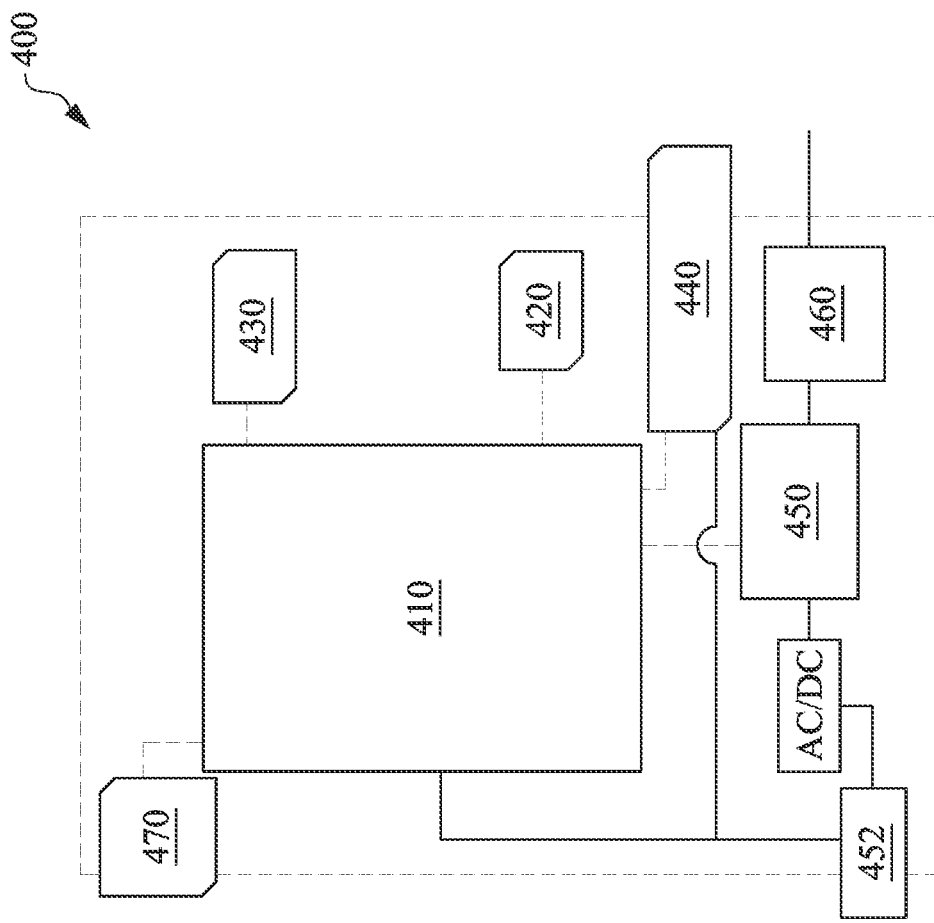
FIG. 5 is a block diagram of a charging station in accordance with some embodiments of the present disclosure.

Reference is made to FIG. 5. FIG. 5 is a block diagram of a charging station in accordance with some embodiments of the present disclosure. In FIG. 5, dotted lines indicate signal lines, and solid lines indicate power lines. A charging station 400 is configured to supply electric power to the tool monitoring device 100 when the AMHS 210 transfers the tool monitoring device 100 from the tools 300A-300C to the charging station 400. In some embodiments, the charging station 400 includes a computer 410, a wireless unit 420, a tag reader 430, a sensor 440, and a power switch 450. The computer 410 is configured to control the charging station 400. The wireless unit 420 is configured to transmit/receive measurement results or manipulation commands. For example, the measurement results or the manipulation commands may be transmitted/received between the wireless units 420 and 116. In some embodiments, the data of the environmental parameters that are stored in the storage device of the processor 113 of the tool monitoring device 100 may be transmitted to the computer 410 through the wireless units 420 and 116, such that the storage capacity of the storage device of the processor 113 may be recovered and new data may be stored in the storage device of the tool monitoring device 100. The tag reader 430 is configured to transmit interrogator signals and also to receive authentication replies from the tag 115 of FIG. 4. The sensor 440 is configured to detect whether the tool monitoring device 100 is placed on the charging station 400. In some embodiments, another sensor (not shown) may be configured in the charging station 400 in a similar way to the configuration of the sensor 440. The sensor is configured to detect whether a vacuum cleaner (not shown) is placed on the charging station 400. The vacuum cleaner is used to clean the charging station 400, so as to prevent the tool monitoring device 100 from being polluted by the charging station 400. The power switch 450 is electrically connected to a power 452 and configured to control the supply of power to a pogo pin 460. The pogo pin 460 may be coupled to the pogo pin 119A of the tool monitoring device 100, so as to charge the tool monitoring device 100. In some embodiments, the charging station 400 includes an E84 module 470 which is used to communicate with the controlling apparatus 200, such that the OHT vehicle 220 may carry the tool monitoring device 100 to/away from the charging station 400. In some embodiments, the charging station 400 may be used to charge other devices.

Figure 6:
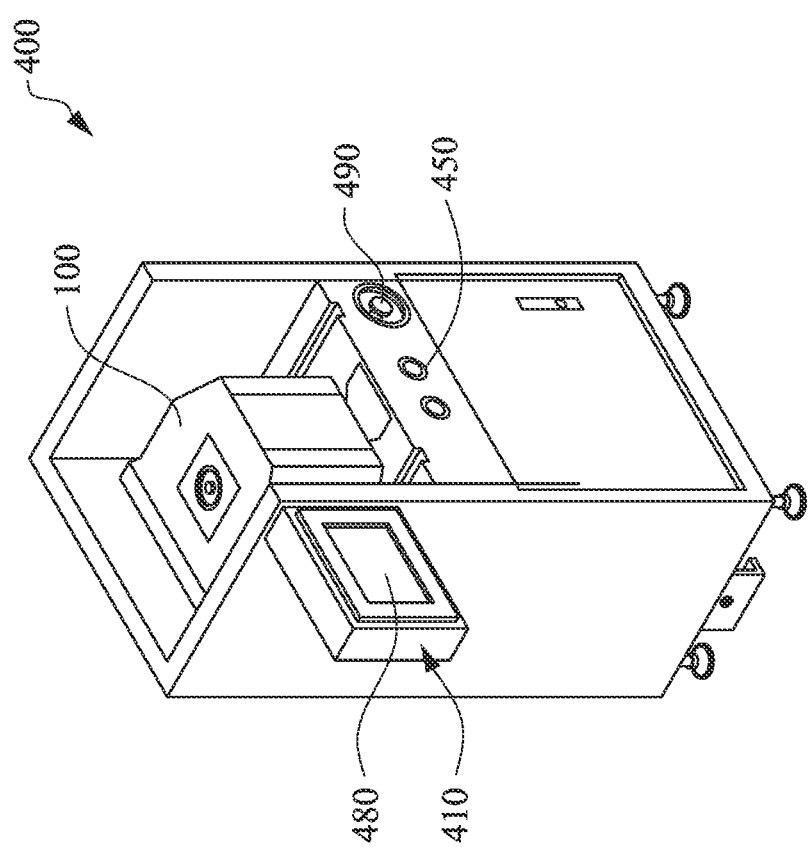
FIG. 6 is a schematic view of a charging station and a tool monitoring device in accordance with some embodiments of the present disclosure.

Reference is made to FIG. 6. FIG. 6 is a schematic view of a charging station and a tool monitoring device in accordance with some embodiments of the present disclosure. The tool monitoring device 100 is connected to the charging station 400. The computer 410 of the charging station 400 may be further coupled with a user interface 480. The state of the tool monitoring device 100 such as the level of the electric power or errors may be read through the user interface 480. Furthermore, transmitting the monitored environmental parameters from the tool monitoring device 100 to the computer 410 may be manually performed using the user interface 480. In some embodiments, the charging station 400 may include an emergency stop push button 490. It is noted that while different outer shapes of the tool monitoring device 100 are respectively shown in FIG. 2 and FIG. 6, the outer shape of the tool monitoring device 100 is not limited to a specific shape as long as the tool monitoring device 100 can be carried by the OHT vehicle 220.

Referring to FIG. 1A again, in some embodiments, the controlling apparatus 200 is configured for controlling the operation of the tool monitoring device 100, the AMHS 210, the tools 300A-300C and the charging station 400. For example, the controlling apparatus 200 controls the AMHS 210 to convey the tool monitoring device 100 and/or the wafer pod 101 housing the wafers from one load port to another load port in the tools 300A-300C to perform the monitoring operation or a certain process according to a preset schedule. In some embodiments, the controlling apparatus 200 is also configured for controlling the operation of the tool monitoring device 100. The controlling apparatus 200 may control the tool monitoring device 100 using wireless communication techniques. In some embodiments, the controlling apparatus 200 is configured for monitoring the tools 300A-300C, the AMHS 210, the tool monitoring device 100, and the charging station 400.

Figure 7:
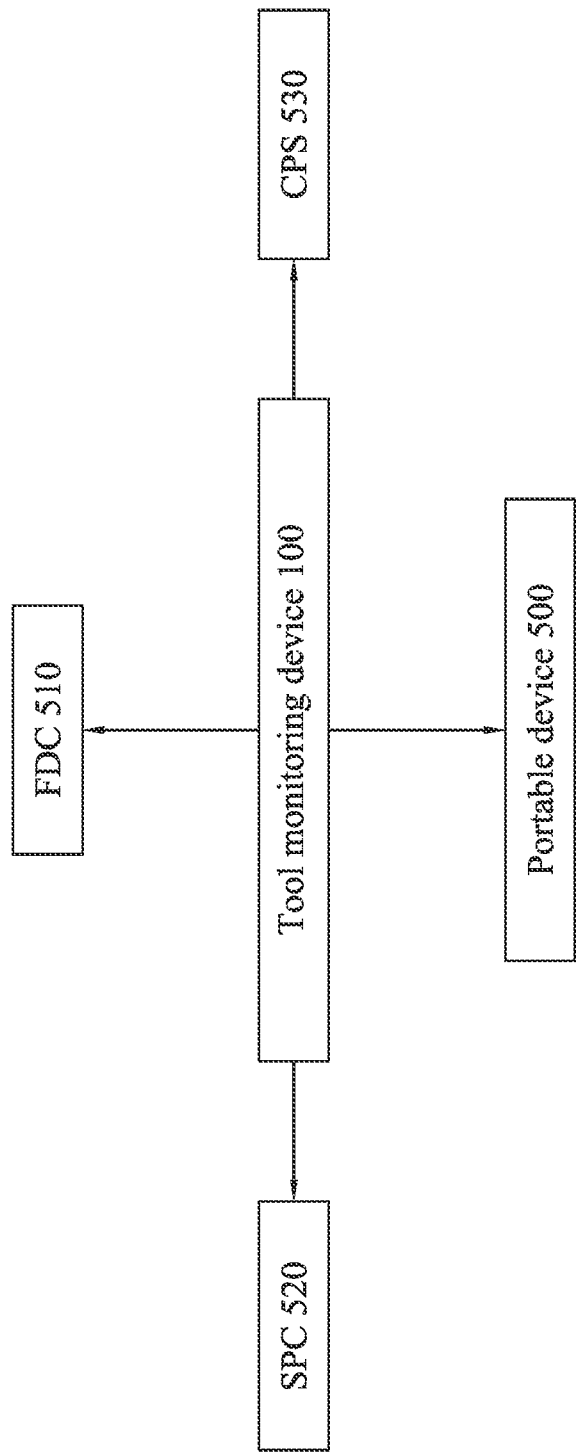
FIG. 7 shows devices and systems that may be coupled to a tool monitoring device of the present disclosure.

Reference is made to FIG. 7. FIG. 7 shows devices and systems that may be coupled to a tool monitoring device of the present disclosure. In some embodiments, the tool monitoring device 100 may be coupled to a portable device 500 such as a mobile phone through the wireless unit 116. When the environmental parameters monitored by the device 100 do not comply with the predetermined standards, the tool monitoring device 100 may send an alarm to the portable device 500, so as to inform users about the problems of the tool. In some embodiments, the tool monitoring device 100 may be coupled to a data collection system including a fault detection and classification (FDC) system 510, a statistical process control (SPC) system 520, a contamination prevention system (CPS) system 530 or a combination thereof.

In some embodiments, the tool monitoring device 100 is coupled to the FDC system 510. The environmental parameters monitored by the tool monitoring device 100 may be transmitted to the FDC system 510 immediately, and long-term monitoring may be performed to observe a trend of each environmental parameter. When an abnormal trend of one or more environmental parameters is observed, the FDC system 510 may send alarms to inform the users. The abnormal trend may be a situation in which one or more of the environmental parameters continuously increase or a situation in which the environmental parameters continuously decrease in a time-based manner. In some embodiments, the abnormal trend may indicate some issues occurring in the tools, in which such issues have not caused a serious problem with the tool that may lead to the unsatisfactory environmental parameters. With the long-term monitoring, the issues of the tool may be resolved earlier, the time required for dealing with the issues of the tools may be reduced, and cracks forming in the tools can be prevented. In other embodiments, the tool monitoring device 100 is coupled to the SPC system 520. In other embodiments, the tool monitoring device 100 is coupled to the CPS 530. Long-term monitoring similar to that performed by the FDC system 510 may be also performed by the SPC system 520 and the CPS 530.

Figure 8:
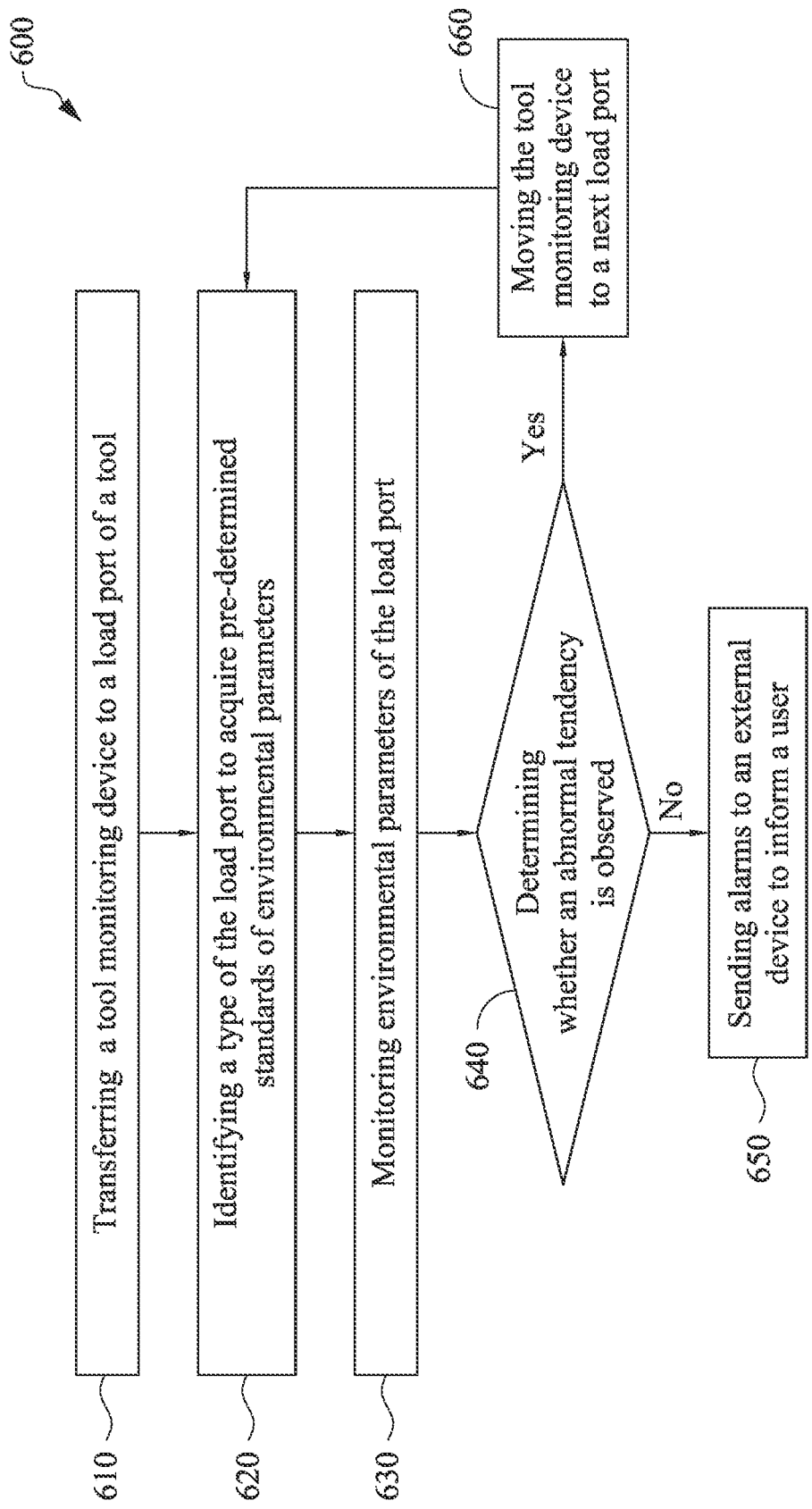
FIG. 8 is a flow chart showing a method of monitoring environmental parameters of a load port in accordance with some embodiments of the present disclosure.

FIG. 8 is a flow chart showing a method 600 of monitoring environmental parameters of a load port in accordance with some embodiments of the present disclosure. FIG. 1A and FIG. 1C are further referenced for clear description of the method 600. The method 600 begins with block 610 in which a tool monitoring device is transferred to a load port of a tool. In some embodiments of the block 610, the tool monitoring device 100 is transferred to the load port 311 of the tool 300A by a number of operations. First, the wafer pod 120 having the tool monitoring device 100 is gripped by the OHT vehicle 220 and transferred along the rail 230 to the load port 311 of the tool 300A. When the OHT vehicle 220 arrives at the load port 311 of the tool 300A, the OHT vehicle 220 is lowered down to the load port 311 and the tool monitoring device 100 is placed on the platform 310 of the load port 311. Afterwards, the OHT vehicle 220 raises up to be transported by the AHMS 210.

In some embodiments, when the tool monitoring device 100 is placed on the load port 311 of the tool 300A, with further reference to FIG. 3, the positioning elements 150 receive the kinematic pins of the load ports 311, and the pins 330A-330D are plugged in the holes 130-136. As a result, the tool monitoring device 100 is positioned in a predetermined position of the load port 311. In some embodiments, when the tool monitoring device 100 is placed on the load port 311 of the tool 300A, the tool accessing door 340 corresponding to the load port 311 is kept closed.

Next, in block 620, a type of the load port is identified, so as to acquire predetermined standards of the environmental parameters. In some embodiments of the block 620, the load port 310 may be identified by its pins 330A-330D. For example, as shown in FIG. 1C, the load port 311 may have the pins 330A and 330D with smaller heights (or the pins 330A and 330D may be flat) and the pins 330B and 330C with greater heights, which may be presented as [0,1,1,0]. When the tool monitoring device 100 is placed on the load port 311, the holes 130, 132, 134 and 136 respectively correspond to the pins 330A-330D, and the sensors 112A-112D arranged in proximity to the holes 130-136 may detect the relative heights of the pins 330A-330D, so as to identify the load port 311 to acquire its corresponding standards for the environmental parameters from the storage device in the processor 113. In certain embodiments where the tool 300A implements a process of depositing a high-k dielectric material, the predetermined standards of the environmental parameters for the load port of the tool that is used to deposit the high-k dielectric material are acquired. In other embodiments, height configurations of the load ports 312-316 may be presented as [1,0,0,0], [0,0,1,1], [0,1,0,1], [0,0,0,1], [0,0,0,0], or any other configurations of the pin heights. In some embodiments, the load ports that belong to the same tool (e.g., the load ports 311 and 312 of the tool 300A) may use the same pin height configuration. In other embodiments, each load port has its own pin height configuration. The example of the height configuration of the pins is given merely as an example to clearly describe a single embodiment, and the type of the load port may be identified by any other suitable method.

Next, in block 630, environmental parameters of the load port are monitored. In some embodiments of the block 630, the tool monitoring device 100 having the configuration similar to that shown in FIG. 4 monitors the environmental parameters of the load port 311, such as the leveling states, the contamination level, vibration, temperature, humidity, air, noise, bio-hazardous particles, any suitable environmental parameters, or combinations thereof. In some embodiments, the environment around the load port 311 may be observed through the charge-coupled devices (CCDs) 128 disposed in the tool monitoring device 100, in which the CCDs 128 may be coupled to an external display that is able to receive the signals transmitted from the tool monitoring device 100.

Subsequently, in block 640, a determination is made as to whether the monitored environmental parameters comply with the predetermined standards. In some embodiments of the block 640, the determining operation may be performed by the processor 113 shown in FIG. 4. In block 660, when the environmental parameters comply with the predetermined standards, the tool monitoring device 100 may be moved to a next load port (e.g., the load port 313), and the operations of the blocks 610-640 may be repeatedly performed, so as to regularly monitor the environmental parameters of all the load ports in the FAB. Furthermore, after moving the tool monitoring device to the next load port, the wafer pod housing a plurality of wafers is transferred using the AMHS. On the other hand, in block 650, when the environmental parameters do not comply with the predetermined standards, the tool monitoring device 100 may send an alarm to an external device through the wireless unit 116 configured in the tool monitoring device 100, so as to inform the users and allow them to resolve the tool issues. In some embodiments, the alarm specifies what parameter of which load port is abnormal, so that the users can resolve the problem more quickly. However, other information may also be provided in other embodiments. In some embodiments, the environmental parameters do not comply with the predetermined standards if one of the environmental parameters is greater than a numerical range of the standards. In other embodiments, the environmental parameters do not comply with the predetermined standards if one of the environmental parameters is smaller than a numerical range of the standards.

In some embodiments, the duration of the monitoring operation is determined as the time between when the OHT vehicle 220 places the tool monitoring device 100 on or at the load port 311, and the time when the OHT vehicle 220 removes the tool monitoring device 100 from the load port 311. The OHT vehicle 220 may be operated according to a program which is preset in the controlling apparatus 200. However, it should be appreciated that other variations and modifications can be made to embodiments of the disclosure. In some embodiments, the duration of the monitoring operation performed on each load port may be, for example, 2 hours to 4 hours, so as to ensure a good monitoring operation.

In some embodiments, the monitoring operation is initiated and finished according to commands issued by the controlling apparatus 200. For example, in cases where the tool monitoring device 100 is placed on the load port 311 but the monitoring operation is not automatically performed, the controlling apparatus 200 issues an RF signal to drive the tool monitoring device 100 to monitor the environmental parameters of the load port 311. Afterwards, the controlling apparatus 200 may issue an RF signal to stop the monitoring operation of the tool monitoring device 100, and the monitoring operation is finished.

The tool monitoring device 100 may be used to monitor a number of load ports. In some embodiments, the number of load ports or the sequence of the load ports to be monitored by the tool monitoring device 100 is set in advance, and the controlling apparatus 200 controls the AMHS 210 to dispatch the tool monitoring device 100 automatically according to the preset data.

In some embodiments, when the monitoring operation of the load port 311 is finished and the tool monitoring device 100 moves to the next load port 312 (the block 660), the method may further include transferring the wafer pod 101 housing several wafers to the load port 311 and placing the wafer pod 101 on the load port 311, as shown in FIG. 1B. In such embodiments, the tool access door 340 corresponding to the load port 311 is opened, so as to transfer the wafers into the tool 300A and process the wafers (i.e., perform the semiconductor device manufacturing process). However, when any abnormal situation of the load port is detected by the tool monitoring device 100, the wafer pod 101 housing the wafers will not be placed on the abnormal load port.

Figure 9:
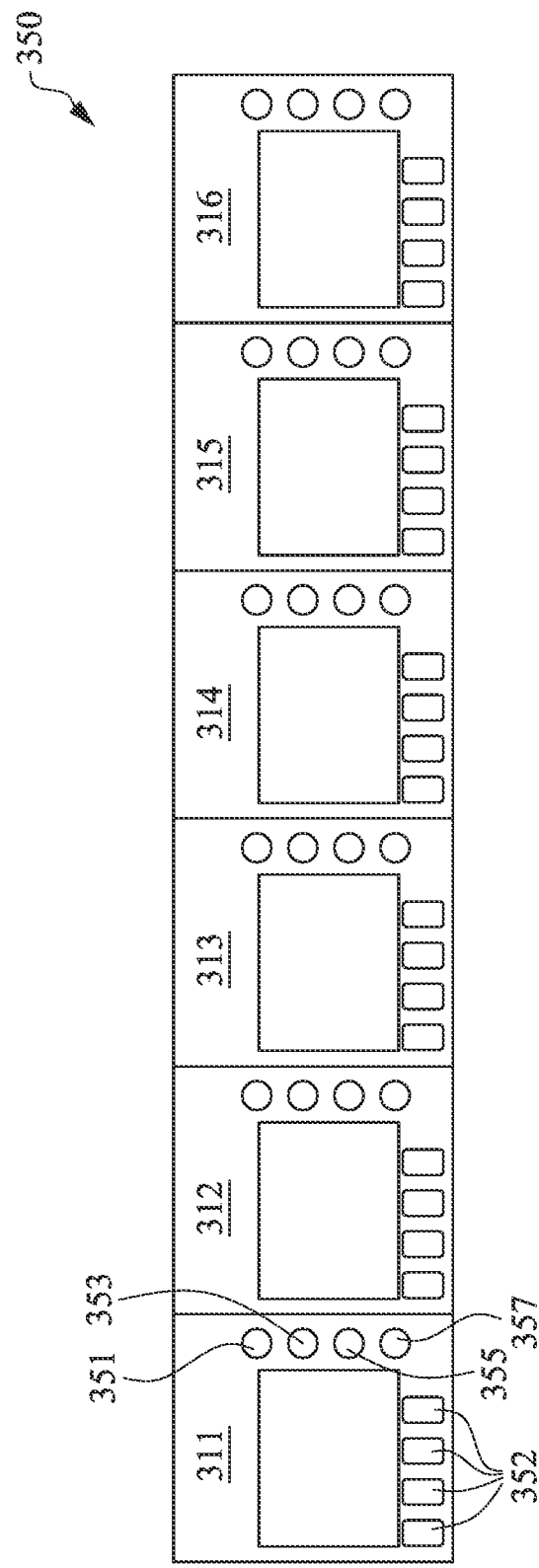
FIG. 9 is a schematic view of a display panel of a tool.

Reference is made to FIG. 9. FIG. 9 is a schematic view of a display panel of a tool. In other embodiments, the monitored results may be shown on a display panel 350 of the tools 300A-300C. As shown in FIG. 9, blocks 352 may show which chamber of the process tools 300A-300C are processing the wafers, and blocks 351, 353, 355 and 357 may respectively show the monitored results. For example, the block 351 represents the leveling state of the load port 311, the block 353 represents the contamination level of the load port 311, the block 355 represents the vibration of the load port 311, and the block 357 represents the temperature of the load port 311. When the leveling state of the load port 311 is abnormal, the block 351 may change its color to show the abnormality.

Figure 10:
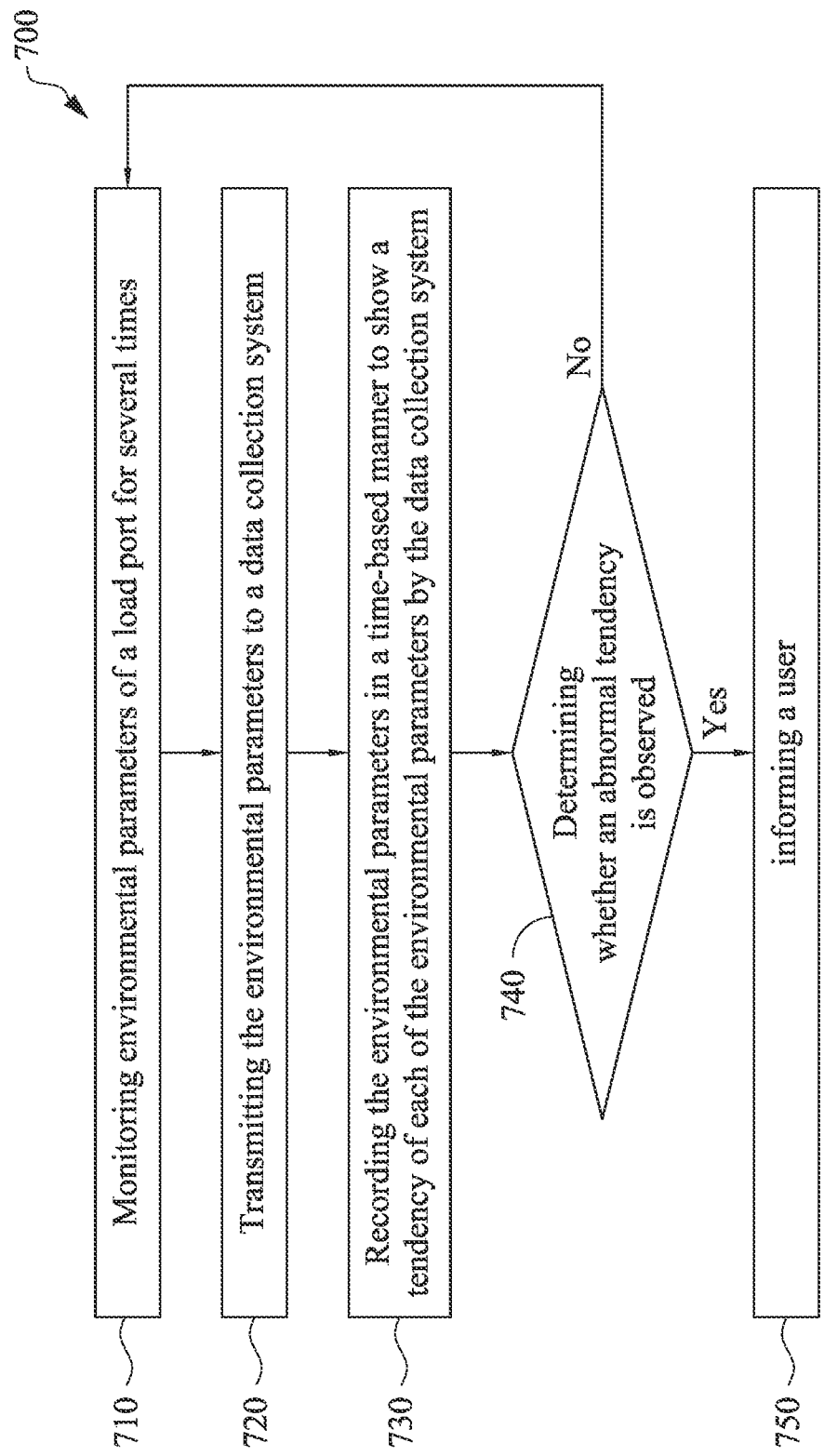
FIG. 10 is a flow chart showing a method of long-term monitoring using a tool monitoring device in accordance with some embodiments of the present disclosure.

FIG. 10 is a flow chart showing a method 700 of long-term monitoring using a tool monitoring device in accordance with some embodiments of the present disclosure. FIG. 1A, FIG. 7 and FIG. 8 are further referenced for clear description of the method 700. Long-term monitoring of each of the load ports may be performed by a method that is similar to the method shown in FIG. 8. The long-term monitoring method 700 begins with block 710, in which environmental parameters of a load port are monitored several times. In some embodiments, monitoring all of the load ports 311-316 a single time using the method 600 with the tool monitoring device 100 is defined as one cycle of monitoring, and a time for each cycle is defined as a time interval. As a result, in some embodiments of the block 710, plural cycles may be performed, such that the environmental parameters of the load port 311 are monitored several times to achieve long-term monitoring of the load port 311 in a time-based manner. Also, the long-term monitoring of the load ports 312-316 is additionally achieved when the cycles are performed. In other embodiments, the time interval of one of the cycles may be different from a duration of the time interval of any one or all of the other cycles. In some alternative embodiments, the load ports 311-313 may be monitored by the tool monitoring device 100, the load ports 314-316 may be monitored by another tool monitoring device that is not illustrated in the figures, and thus the time interval for accomplishing the cycle including monitoring the load port 311 can be reduced, so that the environmental parameters of the load port 311 can be monitored more frequently.

Next, in block 720, the environmental parameters are transmitted to a data collection system. In some embodiments of the block 720, when the monitoring operation of the load port 311 is finished (e.g., when the tool monitoring device 100 leaves the load port 311 and moves to the load port 312), the monitored environmental parameters of the load port 311 are transmitted to the FDC system 510 of FIG. 7 through the wireless unit 116 of the tool monitoring device 100. In other embodiments, the environmental parameters of the load port 311 may be transmitted to the FDC system 510 after the cycle is finished. For example, the environmental parameters of all of the load ports 311-316 in one cycle may be transmitted to the FDC system 510 before the next cycle is performed.

Afterwards, in block 730, the data collection system records the environmental parameters in a time-based manner to show a trend of each of the environmental parameters. In some embodiments of the block 730, the environmental parameters of the load port 311 monitored in each cycle are recorded in the FDC system 510, and then the FDC system 510 may respectively show the trends of these environmental parameters in the time-based manner. For example, a contamination level of the load port 311 is long-term monitored, and a diagram having an x-axis of time (or an ordinal number of the monitoring operation) and a y-axis of the contamination level is shown by the FDC system, as shown in FIG. 11. In some embodiments, the operation of recording the environmental parameters in the time-based manner includes classifying the environmental parameters into their corresponding categories. For example, the parameters of the contamination level may be one category, and the leveling state may be the other category. In some embodiments, these categories are respectively recorded to obtain an individual diagram of each of the environmental parameters in the time-based manner. In other embodiments, different categories of the environmental parameters may be shown in the same diagram.

Next, in block 740, a determination is made as to whether the trend of the environmental parameters is abnormal. In some embodiments, the abnormal trend may be a situation in which the environmental parameters continuously increase in the time-based manner. In other embodiments, the abnormal trend may be a situation in which the environmental parameters keep decreasing in the time-based manner. In certain embodiments, the abnormal trend may be a situation in which the increasing rate or the decreasing rate of the environmental parameters in a certain time period is over a predetermined standard. Reference is made to FIG. 11. FIG. 11 shows a trend of a contamination level of a load port. A predetermined standard 810 of the contamination level is defined, and the monitored numerical value smaller than the standard 810 is taken as complying with the standard. However, the contamination level continuously increases in the time interval between t1 and t2, though the monitored numerical value still complies with the standard 810. The FDC system 510 may determine this phenomenon to be an abnormal trend, and therefore send an alarm to inform the users, as shown in block 750 of FIG. 10. On the other hand, when no abnormal trend is observed, the long-term monitoring of the load port 311 continues. In some embodiments, the long-term monitoring is performed while the semiconductor device manufacturing is performed. However, when the abnormal trend of the environmental parameters of a certain load port is observed, the wafer pod 101 housing the wafers will not be placed on that load port, as described in FIG. 8.

In some embodiments, after the tool monitoring device 100 has been used to monitor a number of load ports, the battery pack 114 (See FIG. 4) in the tool monitoring device 100 may be running low, or running out of power. In this case, the tool monitoring device 100 is automatically transferred to the charging station 400 (See FIG. 5) to recharge the battery pack 114 in the tool monitoring device 100.

For example, when the battery pack 114 in the tool monitoring device 100 is running low, the wireless unit 116 in the tool monitoring device 100 issues a signal to the controlling apparatus 200, and the controlling apparatus 200 drives the AMHS 210 to convey the tool monitoring device 100 to the charging station 400. The battery pack 114 in the tool monitoring device 100 is recharged by the charging station 400. In some other embodiments, after the tool monitoring device 100 is used to monitor a predetermined number of load ports, the tool monitoring device 100 is transferred to the charging station 400 even if the battery pack 114 in the tool monitoring device 100 still has enough power to monitor more load ports.

The tool monitoring device is arranged in a vacant wafer pod, so that the tool monitoring device can be transferred by the transporting system. Accordingly, the tool monitoring device can go around each load port of the tools and regularly monitor one or more environmental parameters around the load port. Furthermore, the environmental parameters can be long-term monitored. In addition, the problems of the tools can be immediately reported, and the time required for dealing with tool problems and the possibility of cracks forming in the tools may be reduced.

In some embodiments, a method for monitoring a tool is provided. The method includes a number of operations. A tool monitoring device is transferred to a load port of a tool. A type of the load port is identified to acquire a predetermined standard of an environmental parameter. The environmental parameter of the load port is monitored by the tool monitoring device. A determination is made as to whether the environmental parameter complies with the predetermined standard.

In some embodiments, a method for monitoring a tool is provided. The method includes a number of operations. An environmental parameter of a load port is monitored. The environmental parameter is transmitted to a data collection system. The environmental parameter is recorded in a time-based manner to show a trend of the environmental parameter by the data collection system. Moreover, a determination is made as to whether an abnormal trend is observed based on the recording.

In some embodiments, a system for monitoring a tool is provided. The system includes a wafer pod, a first sensor disposed in the wafer pod, a power supply disposed in the wafer pod and electrically coupled to the first sensor, a wireless unit disposed in the wafer pod and coupled to the first sensor, and a transporting system configured to transfer the wafer pod from one load port to another load port.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   transferring a tool monitoring device to a load port of a tool;
   monitoring an environmental parameter of the load port by the tool monitoring device, wherein monitoring the environmental parameter of the load port is performed by mounting a particle counter on a pin arranged on the load port;
   after monitoring the environmental parameter of the load port, removing the tool monitoring device from the load port; and
   closing a door of the tool in front of the load port, wherein the door of the tool is kept closed during a period from a time of transferring the tool monitoring device to the load port to a time of removing the tool monitoring device from the load port.

2. The method of claim 1, further comprising:
   transferring a wafer pod housing a plurality of wafers to the load port of the tool; and
   opening the door of the tool in front of the load port when the wafer pod housing the plurality of wafers is on the load port.

3. The method of claim 1, wherein no wafer is placed in the tool monitoring device when monitoring the environmental parameter of the load port by the tool monitoring device.

4. The method of claim 1, further comprising identifying a type of the load port by the tool monitoring device prior to monitoring the environmental parameter of the load port by the tool monitoring device.

5. The method of claim 4, wherein identifying the type of the load port comprises identifying a height configuration of pins arranged on the load port.

6. The method of claim 1, further comprising charging the tool monitoring device.

7. A method comprising:
   placing a tool monitoring device on a load port of a tool, wherein the tool monitoring device comprises a wafer pod and a monitoring module inside the wafer pod;
   identifying a type of the load port by the tool monitoring device, comprising identifying a height configuration of pins arranged on the load port;
   monitoring an environment around the load port and outside the wafer pod by using a charge-coupled device (CCD) disposed inside the wafer pod of the tool monitoring device and on the monitoring module of the tool monitoring device; and
   determining whether the environment around the load port complies with a predetermined standard based on images obtained by the CCD.

8. The method of claim 7, further comprising:
   when the determination determines that the environment around the load port complies with the predetermined standard, moving the tool monitoring device to a next load port; and
   when the determination determines that the environment around the load port does not comply with the predetermined standard, sending an alarm to an external device.

9. The method of claim 7, further comprising monitoring a contamination level of a pin on the load port by the monitoring module.

10. The method of claim 9, further comprising amplifying a signal of the contamination level monitored by the monitoring module.

11. The method of claim 7, further comprising monitoring a leveling state of the load port by the monitoring module.

12. The method of claim 11, further comprising adjusting the leveling state of the load port according to the leveling state monitored by the monitoring module.

13. The method of claim 7, further comprising monitoring vibration, temperature, humidity, air, noise, or bio-hazardous particles of the load port by the monitoring module.

14. A method comprising:
   transferring a tool monitoring device to a load port of a tool using an automatic material handling system (AMHS);
   identifying a type of the load port by the tool monitoring device, comprising identifying a height configuration of pins arranged on the load port;
   transferring a wafer pod housing a plurality of wafers using the AMHS;
   monitoring an environmental parameter of the load port by the tool monitoring device;
   determining whether the environmental parameter complies with a predetermined standard; and
   when the determination determines that the environmental parameter does not comply with the predetermined standard, sending an alarm to the AMHS such that the AMHS stops transferring the wafer pod housing the plurality of wafers to the load port of the tool.

15. The method of claim 14, further comprising informing a user when the determination determines that the environmental parameter does not comply with the predetermined standard.

16. The method of claim 14, further comprising closing a door of the tool prior to transferring the tool monitoring device to the load port of the tool.

17. The method of claim 16, wherein the door is kept closed when monitoring the environmental parameter of the load port by the tool monitoring device.

18. The method of claim 14, wherein the environmental parameter comprises temperature, humidity and degree of contamination.

19. The method of claim 14, wherein no wafer is placed in the tool monitoring device.

20. The method of claim 14, wherein monitoring the environmental parameter of the load port is performed by mounting a particle counter on a pin arranged on the load port.

* * * * *